United States Patent
Steiner et al.

(10) Patent No.: US 10,263,611 B2
(45) Date of Patent: Apr. 16, 2019

(54) DC SWITCHING DEVICE AND METHOD OF CONTROL

(71) Applicant: AIRBUS DEFENCE AND SPACE GMBH, Taufkirchen (DE)

(72) Inventors: Gerhard Steiner, Mindelheim (DE); Alexander Kaiser, Wellendingen (DE); Peter Jaenker, Ottobrunn (DE)

(73) Assignee: Airbus Defence and Space GmbH, Taufkirchen (DE)

( * ) Notice: Subject to any disclaimer, the term of this patent is extended or adjusted under 35 U.S.C. 154(b) by 0 days.

(21) Appl. No.: 15/618,099

(22) Filed: Jun. 8, 2017

(65) Prior Publication Data
US 2017/0346478 A1   Nov. 30, 2017

Related U.S. Application Data

(63) Continuation of application No. PCT/EP2015/002450, filed on Dec. 4, 2015.

(30) Foreign Application Priority Data

Dec. 18, 2014 (DE) .................... 10 2014 226 475

(51) Int. Cl.
*H03K 17/08* (2006.01)
*H03K 17/12* (2006.01)
(Continued)

(52) U.S. Cl.
CPC ............ *H03K 17/08* (2013.01); *H03K 3/012* (2013.01); *H03K 17/12* (2013.01); *H03K 17/168* (2013.01);
(Continued)

(58) Field of Classification Search
CPC ....... H03K 17/08; H03K 17/12; H03K 17/168; H03K 17/567; H03K 17/687; H03K 17/6874; H03K 3/012
(Continued)

(56) References Cited

U.S. PATENT DOCUMENTS 5,581,208 A * 12/1996 Gaubatz .................. B60R 16/03
                                                          307/10.1
5,610,507 A *  3/1997 Brittan ................. H03K 17/122
                                                          323/272
(Continued)

FOREIGN PATENT DOCUMENTS

DE    10 2012 207222 A1    11/2012
EP       0443155 A1         8/1991
(Continued)

OTHER PUBLICATIONS

International Search Report and Written Opinion for Application No. PCT/EP2015/002450 dated Jun. 17, 2016.
(Continued)

*Primary Examiner* — Thomas Skibinski
(74) *Attorney, Agent, or Firm* — Jenkins, Wilson, Taylor & Hunt, P.A.

(57) ABSTRACT

A DC switching device has at least one switching unit which is arranged between two terminals. Further, the DC switching device has a control unit for controlling the at least one switching unit. The switching unit has a first and a second semiconductor switching element, which are arranged in parallel with one another, the first switching element being a high-voltage switching element and the second switching element being a low-power-loss switching element. The switching unit is controllable by the control unit in such a way that, when the switching unit is switched off, initially the second switching element is switched to be non-conductive, and subsequently the first switching unit is switched to (Continued)

be non-conductive, and when the switching unit is switched on, initially the first switching element is switched to be conductive and subsequently the second switching element is switched to be conductive.

18 Claims, 2 Drawing Sheets

(51) Int. Cl.
  *H03K 17/16* (2006.01)
  *H03K 17/567* (2006.01)
  *H03K 17/687* (2006.01)
  *H03K 3/012* (2006.01)

(52) U.S. Cl.
  CPC ......... *H03K 17/567* (2013.01); *H03K 17/687* (2013.01); *H03K 17/6874* (2013.01); *H03K 2217/0009* (2013.01)

(58) Field of Classification Search
  USPC ........ 327/108–112, 427, 434, 437, 379–405; 326/82, 83, 87
  See application file for complete search history.

(56) References Cited

U.S. PATENT DOCUMENTS

| | | |
|---|---|---|
| 8,766,702 B2 | 7/2014 | Hussein et al. |
| 2009/0289691 A1* | 11/2009 | Fuller ................. H03K 17/166 327/432 |
| 2010/0172063 A1* | 7/2010 | Liu .......................... H02H 1/04 361/118 |
| 2011/0002073 A1 | 1/2011 | Fukuda et al. |
| 2012/0057387 A1 | 3/2012 | Lai et al. |
| 2012/0307540 A1* | 12/2012 | Tagome ................ H02M 1/088 363/131 |
| 2013/0050880 A1* | 2/2013 | Rozman ................ H02H 3/025 361/18 |
| 2013/0062626 A1* | 3/2013 | Takao .................. H03K 17/127 257/77 |

FOREIGN PATENT DOCUMENTS

| | | |
|---|---|---|
| EP | 2124340 A2 | 11/2009 |
| EP | 2369744 A1 | 9/2011 |
| JP | 2009081969 A | 4/2009 |
| JP | 2009142070 A | 6/2009 |
| WO | WO2016096101 A2 | 6/2016 |

OTHER PUBLICATIONS

English Translation of the IPRP and Written Opinion for Application No. PCT/EP2015/002450 dated Jun. 17, 2016.

* cited by examiner

DC SWITCHING DEVICE AND METHOD OF CONTROL

CROSS-REFERENCE TO RELATED APPLICATIONS

This application is a continuation of and claims priority to PCT/EP2015/002450 filed Dec. 4, 2015, which claims the benefit of and priority to German Patent Application No. 10 2014 226 475.8 filed Dec. 18, 2014, the entire disclosures of which are incorporated by reference herein.

TECHNICAL FIELD

The present application relates to switching devices and to methods for controlling these switching devices, the switching devices preferably being DC switching devices. Particularly preferably, the switching devices are constructed to be bidirectional. The DC switching devices described herein and the associated control methods have the technical advantages that improved reliability/safety of the switching devices is achieved at high voltages and/or currents and at the same time power losses are minimized. In addition, the switching devices can switch very rapidly, and very rapid-reaction self-protection of the DC switching devices against excessively high currents is implemented, and makes it possible to shut down or disconnect the current-carrying lines safely and rapidly.

BACKGROUND

Previous solutions for switching devices comprise for example mechanical circuit breakers, but these are too slow in reaction time if short switching processes are required. Electrical switching devices known to date rely for example on insulated-gate bipolar transistors (IGBTs), but these have the disadvantage in particular that they have a threshold voltage (gate voltage) which leads to power losses.

There is thus a need for (DC) switching devices which, in particular for a short switching time, bring about high short-circuit safety and low power losses.

This need is present in particular in electrical systems which have large, low-impedance power source(s), such as large batteries or accumulators. Systems of this type are found for example in the field of renewable energy, in automotive engineering or in aircraft construction, where larger and larger DC voltage sources are being used, which have to be able to be switched off safely at high currents without the switching devices burning out. These switching devices should also be constructed to be bidirectional, in such way that it is possible for example for the voltage source to discharge and charge.

SUMMARY

According to one aspect, a DC switching device may have at least one switching unit. The switching unit may be arranged between two terminals. Further, the DC switching device may have at least one control unit for controlling the at least one switching unit. The switching unit may comprise at least a first and a second (semiconductor) switching element, which may be arranged in parallel with one another.

The first switching element may be a high-voltage switching element. In other words, the first switching element may be a robust switching element, in particular more robust than the second switching element. "Robust" means in particular that the switching element is less sensitive to short circuits and/or rapid switching processes in overload. In other words, the high-voltage switching element may be robust against short circuits and/or rapid switching processes in overload. Thus, the first switching element may for example be able to withstand high currents and/or voltages for a particular time without burning out or otherwise being damaged. For example, the first switching element may withstand double the nominal current or a decrease in voltage from double a nominal voltage for a particular duration, for example 10 µs. However, the first switching element may bring about a higher power loss than the second switching element throughout the operating range.

By contrast, the second switching element may be a low-power-loss switching element. This in particular means that the second switching element has a low power loss throughout the operating range, for example because the second switching element has ohmic properties throughout the operating range. "Low-power-loss switching element" thus means in particular that the power loss for this switching element is minimized throughout the operating range, in particular by comparison with the first switching element.

The combination of the two aforementioned switching elements, which may be connected in parallel, thus has the advantage that the robustness of the first switching element is optimally combined with the lower power loss of the second switching element so as to be able to provide a more robust and lower-power-loss switching device overall.

Further, the first switching element may have current-limiting properties, this having the technical advantage, during the switching method described below, that for example short circuit currents can be limited simply by closing the first switching element. By contrast, the second switching element may be set up or configured in such a way that it has no current-limiting properties. The two, first and second switching elements may have a very high cut-off voltage of for example 1200 V.

Further, the switching unit may be controllable by the control unit or the control unit may control the switching unit in such a way that, when the switching unit is switched off, initially the second switching element is switched to be non-conductive, and subsequently the first switching element is switched to be non-conductive. When the switching unit is switched on, initially the first switching element may be switched to be conductive and subsequently the second switching element may be switched to be conductive.

The terminals may in particular be suitable for connecting a battery or an accumulator to an on-board network, for example of an aircraft. The switching units may also further comprise diodes, for example free-wheeling diodes, which may be arranged in parallel with at least one switching element.

The aforementioned sequence of switching the switching elements does not exclude the possibility of further intermediate steps being involved.

The DC switching device makes it possible for the switching unit to be shut down safely and rapidly even for high powers/currents to be controlled, it being possible to minimize the power losses. Among other things, these advantages can be achieved in that the two described switching elements having the specific properties thereof are connected in parallel and can be actuated separately. The actuation whereby, during switching on, initially the high-voltage-resistant or robust switching element is switched on or switched to be conductive, has the result that high power can be handled safely and burnout and the like do not occur. In addition, the first switching element is already current-limiting. Additionally switching the further, parallel switching element subsequently brings about a reduction in the power losses, in such a way that low-power-loss and also rapid and high-voltage-proof switching is made possible. Switching off, during which the high-voltage-resistant switching element definitively cuts off the line, is based on the same principle, in such a way that the same advantages can also be achieved during the switch-off process.

Further, the DC switching device may have at least two switching units, which may be arranged between the two terminals in such a way that a terminal can be assigned to each switching unit. This construction makes possible in particular bidirectional control of electrical currents, which may flow between the two terminals in both directions. One switching unit is formed for or assigned to each current direction. Thus, by the described DC switching device as a switch for a battery energy source, it can be provided that both charging and discharging can be regulated. During a discharge process, for example one switching unit may be made constantly conductive, while the second switching unit can actively be switched to be conductive or non-conductive. During a charging process, the roles of the two switching units can subsequently be exchanged. The control unit may activate the required switching unit for the current mode of operation in each case. For example, during discharge, the switching unit closer to the power source may be actively regulated while the switching unit further away is set to be conductive. During the charging process, this may subsequently be reversed.

The control unit may be arranged between the two switching units. The two switching units may be arranged symmetrically about the control unit. This makes possible a very compact and well controllable switching device which has very rapid reaction times as a result of shorter line lengths.

The first switching element of the switching unit may be an insulated-gate bipolar transistor (IGBT). The second switching element may be a metal oxide semiconductor field effect transistor (MOSFET). The MOSFET may be an SiC-MOSFET, in other words a silicon carbide MOSFET. The use of these two transistors has the advantage that IGBTs resist high voltages very well and for a relatively long time, for example for up to 10 μs. The drawback of IGBTs, whereby a threshold voltage leads to higher power losses, is ultimately countered in the switching device described herein by the use of a parallel MOSFET, in particular an SiC-MOSFET. These have lower power losses as a result of a largely ohmic characteristic. The combination of higher voltage safety and simultaneously lower power losses is thus achieved. If a plurality of switching units for different current directions are provided, the switching elements may also be arranged appropriately in accordance with the current direction provided in each case.

Further, the second switching element may also be an integrated gate-commutated thyristor (IGCT), which also does not bring about any current limitation, but, like the SiC-MOSFET, may have lower power losses or conductive losses than the first switching element, for example the IGBT, throughout the operating range.

In addition, a switching unit may also comprise a plurality of first and/or second switching elements arranged in parallel so as to be able to conduct and switch higher currents. In embodiments, a plurality of IGBTs may be arranged in parallel in a switching unit and actuated jointly. A plurality of SiC-MOSFETs or IGCTs may also be arranged in parallel and actuated jointly.

Further, the DC switching device may have lines (branch lines) to a power conversion circuit/power dissipation circuit. The power conversion circuit may comprise capacitors so as to be able to dissipate excess power safely. The branch lines may each be arranged between a switching unit and a terminal. Arranging a power conversion circuit in the switching device thus further increases the safety against high powers and thus against the switching device burning out, since excess power can be safely absorbed.

The control unit may comprise a (rapid) current measurement device, for example a measurement resistor or a shunt, for detecting a current flowing through the switching unit. The current measurement device may be arranged symmetrically, centrally between the switching units, making possible short line lengths which make a short reaction time possible. The control unit may comprise at least a first and a second voltage source, of which the first may be connected to a gate of the first switching element and the second to a gate of the second switching element. For example, two voltage sources for two switching units each having two switching elements may be provided. However, four voltage sources for two switching units each having two switching elements may also be provided, for example. In the first case, the switching device is particularly compact. The control unit may (optionally) further comprise switches for short-circuiting the voltage sources, so as to vary a voltage at the gate of a switching element by short-circuiting a voltage source. In general, the gates of the switching element are actuated by controllable voltage sources or by gate drivers, which are connected to the respective gates and generate a corresponding gate voltage for switching the switching element to be conductive or non-conductive depending on the type of switching element. In this context, the gate voltage for the first and second switching element may have different levels and also different logic states (for example "1" for conductive and "0" for non-conductive or vice versa).

The control unit may further, as an alternative or in addition to the current measurement device, also comprise a voltage detection device, for example for detecting a decrease in voltage across one or more switching units or switching elements.

The term "switched to be conductive" should be understood to the effect that the switching element is thus placed in the current-carrying state or in an open state. "Switched to be non-conductive" should in particular be understood to mean closing the switching element to the flow of electrical current.

The control unit may further comprise a rapid comparator, for example a 50 ohm comparator, which may be set up or configured to compare a measurement value of the current measurement device with at least one reference value, so as to detect a predetermined current threshold being exceeded. The control unit may further be set up or configured to initiate switching off the switching unit if it is detected that the predetermined (first) current threshold is exceeded. The comparator may be set up or configured, for example as a low-resistance comparator, in particular a 50 ohm comparator, in such a way that it can very rapidly detect the current flowing through the switching device or the switching unit(s) and identify whether the current is too high. In particular, this functionality is for emergency shutdown of the open (in other words conducting) switching device, for example if a short circuit occurs and high currents which might damage the switching device very rapidly occur. If the control logic contains limit or threshold values for the currents to be handled, the emergency shutdown may for example be triggered by a threshold value being exceeded. The method is explained in detail below.

Further, in principle, in accordance with and in the context of the present switching device and the associated method, it may be provided that additionally or alternatively the voltages/decreases in voltage in the current-carrying line can be detected, for example by the current measurement device or a current detection device. Alternatively or additionally, voltages or decreases in voltage may also be detected at individual switching elements or switching units. A shutdown, as a result of the current threshold being exceeded as described above and below, can thus additionally or alternatively take place by way of one or more predetermined maximum values for a fall in voltage being exceeded, for example at the switching element and/or the voltage detection device.

Aside from one or more current thresholds, additionally or alternatively one or more thresholds for gradients of the current (first derivative with respect to time) may also be stored and be used for the control.

Further, devices for long-term monitoring of the flowing current, for example a current monitor, may be implemented. Devices for monitoring the decrease in current of some or all switching elements, for example analogue $Vce_{sat}$ detection in the case of an IGBT, may further be implemented.

In addition, in the current-carrying line to which the switching units and the control unit may also be connected, the switching device may comprise a current-sensitive shutdown element, which may be part of the control unit. The current-sensitive shutdown element may, for example in the case of an excessive decrease in voltage over one of the switching elements or switching units or an excessively high current, be able to interrupt the current-carrying line automatically. In other words, the shutdown element may be a switch, for example a semiconductor switch—and in particular a plurality of semiconductor switches may be combined—which automatically and permanently interrupts the line. The voltage/current detection or the detection of a corresponding threshold being exceeded may for example be carried out by the shutdown element itself. This may for example take place in that the current is too high at a semiconductor switch of the shutdown element, in such a way that the line path of this switch is deactivated, bringing about an increase in voltage at a further semiconductor switch of the shutdown element, in such a way that this is also switched to be non-conductive. The interruption of the shutdown element, as described above, can for example only be undone by reactivating the switch, for example by disconnecting the voltage or current source of the switching device. The shutdown element may be provided as an alternative or in addition to the measurement resistor.

A method for controlling a switch-on process of a (for example bidirectional) DC switching device in accordance with one of the examples and aspects described above is further described herein. In the initial state, the parallel switching of a switching unit may be non-conductive (in other words the switching unit is closed), and the method (for opening/switching on) may comprise the steps in the sequence for example given below, intermediate steps and the like potentially being possible. Initially, the first switching element of the switching unit is switched to be conductive. After the first switching element is switched to be conductive, a current which can flow through the switching unit is measured. It should be noted that the current is measured continuously by the control unit or the current measurement device, in such a way that the measurement step may also be referred to as a step of "testing" or "measuring and testing", so as to establish whether a current threshold is exceeded. In addition, alternatively or additionally (simultaneously), it may be provided that the voltage at the switch/switching element is measured/detected, for example by $Vce_{sat}$ detection. From the voltage detection, it can further be possible to establish whether a predetermined (first) threshold of a decrease in voltage (for example across the switch) is exceeded.

The method may further comprise: switching the second switching element of the switching unit to be conductive if the current does not exceed a first current threshold (and/or a first voltage decrease threshold); or switching the first switching element of the switching unit to be non-conductive if the current exceeds a second current threshold greater than the first current threshold and/or the decrease in voltage across the switch takes on excessively high values (by comparison with a predetermined threshold); in other words, additionally or alternatively the first switching element may also be switched to be non-conductive if a second voltage decrease threshold, which may be greater than the first voltage decrease threshold, is exceeded.

The method may further comprise testing whether the current falls below the first current threshold again within a (predetermined) first time period, if the current exceeds the first current threshold after the first switching element is switched to be conductive and does not exceed the second current threshold. The first current element may be switched to be non-conductive if the current does not fall below the value of the first current threshold within the predetermined first time period, in other words remains at the high level. Otherwise, the second switching element may be switched to be conductive if the current falls below the value of the first current threshold again within the predetermined first time period, in other words is in the normal operating range again. Analogously, these method steps may also alternatively or additionally be used with the above-described voltage decrease thresholds (instead of or in addition to the current thresholds or the measured currents).

The above-described two-step switching of the switching elements makes the control, which causes high voltages to be absorbed or carried by the high-voltage-resistant switching element, possible during switch-on. If the current is not above a value critical for the second switching element, the second switching element can safely be switched to be conductive so as to minimize the power losses in subsequent operation.

The first current threshold may for example be the nominal value of the current which the switching device should be able to handle or which should normally be able to flow through the switching device. For example, this nominal value may be 300 A or else for example 1000 A, the second switching element for example being an IGCT for very high nominal values, for example 1000 A. However, the nominal value may also be higher or lower depending on the application. Further, the first current threshold may also be slightly above the nominal value, for example 1.1 times, 1.2 times or 1.25 times the nominal value. The first current threshold may also be a range, for example 1 times to 1.25 times the nominal value. The first current threshold may be the maximum value which the second switching element can conduct without damage. The second current threshold may for example be configured on the basis of the maximum current resistance of the first switching element. For example, values of 2 times or 2.5 times the nominal value may be set in this context. A range of values of for example 2.0 to 2.5 times the nominal value may also be provided, for example. The voltage decrease thresholds, for example a first and a second, may, like the above-described current thresholds, be defined in relation to a nominal voltage; for example, the aforementioned examples of numbers and ranges may also be used for the voltage or also be defined differently from these.

The first predetermined time period may for example be 40 to 100 ms. However, the time period may also be set at much lower values. Assuming that the total switching time of the switching device is to be in the range of a few microseconds, the first predetermined time period may also be in the range of a few microseconds. For example, as a lower range value, the first predetermined time period may also be based on the total switching time, for example 1.5 times, 5 times, 10 times, 100 times, 1000 times or the like.

A switch-off method for controlling a bidirectional DC switching device in accordance with one of the examples and aspects described above is further described herein. In the initial state, the switching elements of a switching unit may be conductive (in other words open). The method for switching off may comprise the steps in the exemplary sequence: switching the second switching element of the switching unit to be non-conductive on the basis of a received stop command; and switching the first switching element of a switching unit to be non-conductive after the expiration of a (predetermined) second time period after the second switching element is switched to be non-conductive. Further steps and/or intermediate steps may be provided. The second time period may for example correspond to the first time period. However, the second time period and the first time period may also be different.

The above-described method makes it possible in particular for the switching device to be able to be closed on the basis of a command, outputted for example by the control unit, without there being any threshold infractions in the current or in the first derivative thereof with respect to time. The process can be carried out very rapidly and is optimized for burnout safety and power losses in particular as a result of the switching sequence. The optional second time period may in particular be set so as to be able to ensure that the second switching element is completely switched off before the first switching element is closed.

An automatic shutdown method for controlling a bidirectional DC switching device in accordance with one of the examples and aspects described above is further described herein. In the initial state, the switching elements of a switching unit may be conductive. The method for shutting down (in particular in emergency situations, for example a short circuit) may comprise the steps (but also further or intermediate steps) in the exemplary sequence of: switching the second switching element of the switching unit to be non-conductive if a current flowing through the switching unit exceeds a first current threshold, so as to protect the element from damage. Alternatively or simultaneously, a further threshold for the increase in current (in other words the first derivative of the current) may be set, and may also be tested so as further to increase the safety. Further, as an alternative or in addition to the two aforementioned examples (current and increase in current), a first current decrease threshold for the voltage being exceeded, which may for example take place at the switching unit, one of the switching elements and/or a voltage measurement device (of the control unit), may cause the second switching element to be switched to be non-conductive.

Further, a step of measuring a current (and/or a voltage or decrease in voltage) flowing through the switching unit after the second switching element is switched to be non-conductive may be provided. Because of the exemplary continuous measurement, this step may also be considered a "testing step", in which the measured current/voltage and the threshold can be compared with one another. The first switching element of the switching unit is switched to be non-conductive after a (predetermined) first time period, discussed previously above, if the current does not fall below the first current threshold/first voltage decrease threshold in the predetermined time period.

The above-described method makes it possible in particular for rapid, automatic shutdown, optimized for safety and power losses, to take place in the case of a current and/or increase in current and/or decrease in voltage which is excessively high for the switching device or for the components of the switching device. A threshold being exceeded can be detected, for example, among other ways, by using the above-described control unit comprising for example a current measurement device (for example a measurement resistor) and a rapid comparator.

In the above method, a further step may be: switching the second switching element of the switching unit to be conductive if the current again falls below the first current threshold within the predetermined first time period. This step may be advantageous in particular if it is not necessary to shut down both switching elements completely, for example if the current has only increased above the threshold briefly and subsequently decreases again rapidly. The switching unit can thus be opened again more rapidly, without power losses occurring as a result of switching the first switching element. Additionally or alternatively, this step may also be carried out if the first voltage decrease threshold is fallen below (again).

In the above method, a further step may be: switching the first switching element to be non-conductive if, after the second switching element is switched to be non-conductive, the current exceeds a second current threshold greater than the first current threshold and/or the voltage exceeds a second voltage decrease threshold greater than the first. This step is advantageous in particular if the current/decrease in voltage rises rapidly and strongly, and in particular above the second threshold described previously above. In this case it is advantageous, for the safety of the switching device, to be able to perform an immediate shutdown instead of waiting for the first time period.

In conclusion, the described switching device combines the technical advantages of high-voltage-resistant and low-power-loss switching elements, while being as compact as possible and light enough still to be useable in the field of aviation. The switching elements are actuated in particular separately and very rapidly, in a level-dependent, state-dependent and stepped manner, ensuring that the switching powers to be controlled are minimized. Arcs can reliably be prevented, the efficiency is increased in particular in partial-load operation by the use of the parallel SiC-MOSFET, and independent current limitation takes place, in particular in that the switch-on and switch-off processes take place by IGBT, while the SiC semiconductors are not active in this state and can basically only be switched on to reduce ON losses in the conductive state of the switching unit. Short circuits and other faults are detected very rapidly, and a very rapid shutdown takes place.

The DC switching device described herein can be used in the field of aircraft construction, since high safety is ensured, in particular against the switching device burning out, including at high currents, this being extremely important in aircraft construction. At the same time, the switching device controls rapid switching processes, which are required in relation to, among other things, emergency shutdowns in the event of short circuits. Further, the power losses are minimized by comparison with known switching devices, and bidirectional functionality is ensured. In addition, the elements are robust against vibrational loads, since no mechanical parts are used.

BRIEF DESCRIPTION OF THE DRAWINGS

The device set out herein and the associated method are described in the following by way of example with reference to the accompanying, example, schematic drawings, in which.

Figure 1:
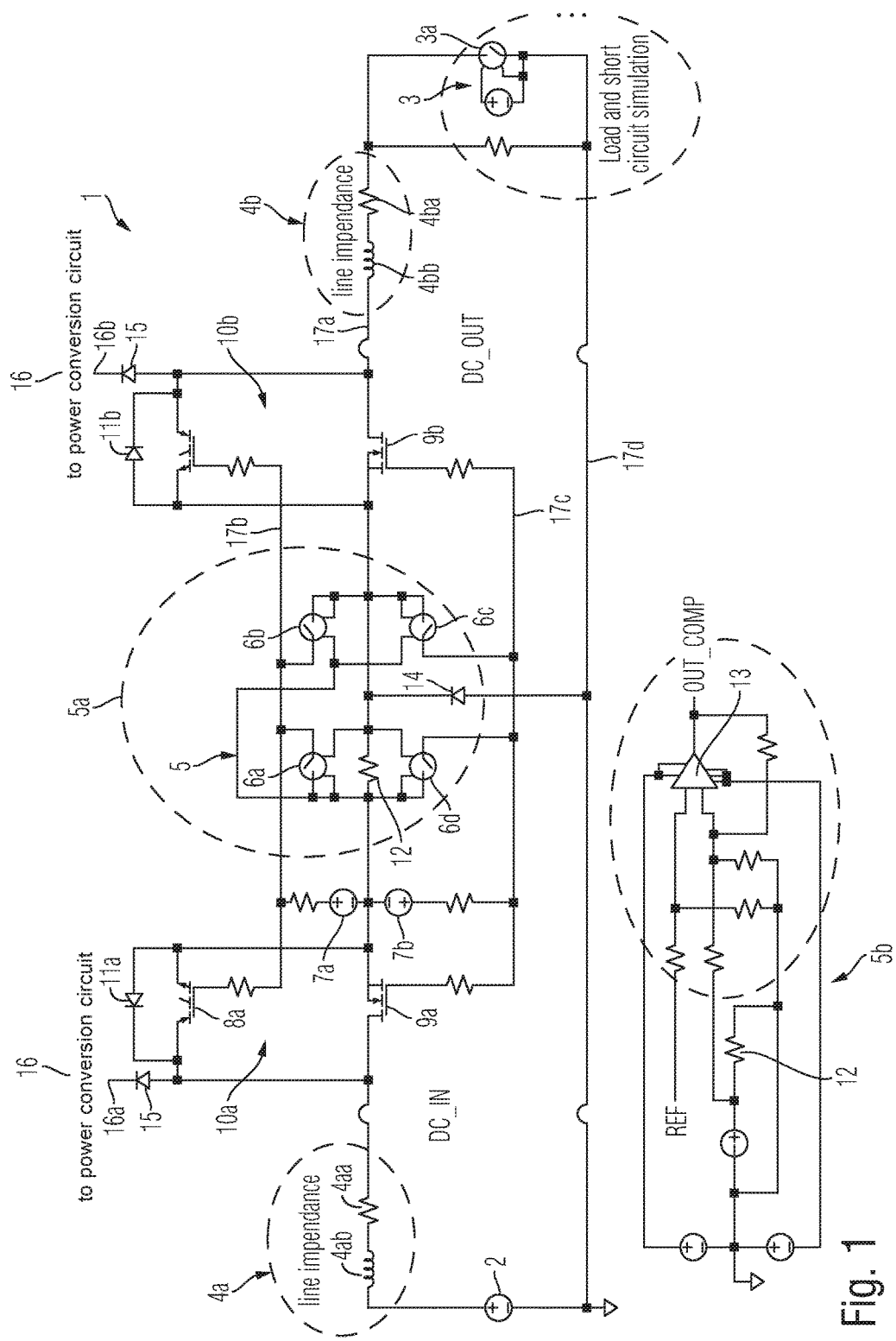
FIG. 1 is a circuit diagram of an example electrical system comprising a bidirectional DC switching device.

In the following, various examples are detailed and described with reference to the drawings. In doing so, like or similar elements in the drawings are denoted by like reference numerals. However, the present device and the method are not limited to the described combinations of features. Rather, further modifications and combinations of features from various examples are also intended to be included in the scope of protection herein.

DETAILED DESCRIPTION

FIG. 1 shows a circuit comprising the bidirectional DC switching device 1 described herein. A voltage source 2 is arranged at the terminal DC-IN on the left-hand side by way of example. A load circuit 3 is arranged on the right-hand side by way of example, and merely for illustrative purposes contains a switch 3a for simulating a short circuit by way of example. Further, in the regions 4a, 4b enclosed in dashed lines on the left and right, FIG. 1 shows a resistor 4aa, 4ba and an impedance 4ab, 4bb in each case, by way of example, for simulating the electrical properties of the lines.

In the center, FIG. 1 further shows an example of a control unit 5 on the system level; part of the control unit 5 is in the large enclosed region 5a. The control unit 5 is merely shown by way of example and for simulation purposes. The actual configuration may deviate from that shown in FIG. 1, as is also the case for the above-described structures as regards the regions 4a, 4b and the components connected to the terminals DC-IN and DC-OUT.

The control unit 5 comprises for example switches 6a-d, which when closed short-circuit the voltage sources 7a, 7b which are likewise assigned to the control unit 5. The voltage source 7a is connected to at least one gate of a first switching element 8a. When this voltage source 7a is short-circuited, the gate voltage at the first switching element(s) 8a is changed, in such a way that it opens. FIG. 1 shows two first switching elements 8a, 8b of two switching units 10a, 10b, which are both connected to the voltage source 7a. Naturally, a plurality of voltage sources 7a may also be provided, in such a way that the first switching elements 8a, 8b can be switched independently of one another. It should further be noted that the voltage sources 7a, 7b are merely shown by way of example, and other options for switching the switching units 10a, 10b or the switching elements 8, 9 thereof may also be used.

The second voltage source 7b is further connected to the gates of two second switching elements 9a, 9b, analogously to the circuit described above. As already described, the second switching elements 9a, 9b may be activated/deactivated or switched to be non-conductive or conductive by short-circuiting/not short-circuiting the second voltage source 7b, by way of example. In this case too, a plurality of voltage sources 7b may be provided, so as to make separate actuation of the second switching elements 9a, 9b possible.

In principle, the switching elements may be controlled by controlled voltage sources, which act on the gate terminals of the switching elements, generate the desired gate voltages there, and place the switching elements in a conductive or non-conductive state. Many different configurations of the control unit are possible and are intended to fall within the disclosure herein.

The switching units 10a, 10b introduced above are arranged substantially symmetrically about the control unit 5, and are substantially identical in construction. In particular, these each contain the two first and second switching elements 8, 9 arranged mutually parallel. The first switching element 8 may be an IGBT having a high voltage tolerance. The second switching element 9 may be an SiC-MOSFET having low power losses. In addition, a diode 11a, 11b may also be integrated into the switching units 10a, 10b, so as to absorb inductances, in other words may act as a freewheeling diode.

By way of example, the control unit 5 may further contain the part denoted "5b" in FIG. 1. The unit 5b is basically a detection and comparison unit 5b, shown in FIG. 1 merely for simulation purposes. The actual configuration may differ from the drawing shown. The unit 5b basically comprises a measurement resistor 12 (inserted by way of example as a current measurement device), also shown in the upper circuit diagram (in the region 5a), and a comparator 13, which compares a reference value with the measured value at the measurement resistor 12 so as for example to detect an increase in current. As stated above, the unit 5b should merely be interpreted schematically; thus, for example, the current source has merely been arranged there for simulation purposes so as to simulate the current flowing in the switching device.

The output signal "Out-Comp" of the comparator 13 is for the control for opening/closing the individual switching elements 8, 9. Further units 5b of this type may be provided so as to be able to output separate control commands/output signals for individual switching elements 8, 9. Examples of the use of the unit 5b and the use of the control commands are described in greater detail in connection with FIG. 2.

FIG. 1 further shows a diode 14 which separates the two potentials of the circuit from one another. In addition, two diodes 15 are arranged upstream from the branch lines 16a, 16b to a power conversion circuit 16. The power conversion circuit 16 is not shown in greater detail. It has the technical function of being able to dissipate excess power. For this purpose, it may for example comprise capacitors.

As is further shown in FIG. 1, a current-carrying line 17a, to which the switching units 10a, 10b, the control unit 5 and the branch lines 16a, 16b are connected, extends between the terminals DC-IN and DC-OUT. The second switching elements 9a, 9b and the measurement resistor 12 are arranged in series with one another on this current-carrying line 17a. The first switching elements 8a, 8b, the gate terminals of which are connected via a further line 17b to the switches 6a, 6b (top of FIG. 1) of the control unit 5 and the voltage source 7a, are arranged in parallel with the second switching elements 9a, 9b. The gate terminals of the second switching elements 9a, 9b are connected via the line 17c to the switches 6c, 6d of the control unit 5 and the voltage source 7b. The above-described diode 14 separates the line 17a from the lower line 17d shown in FIG. 1, which is connected to the earth.

Figure 2:
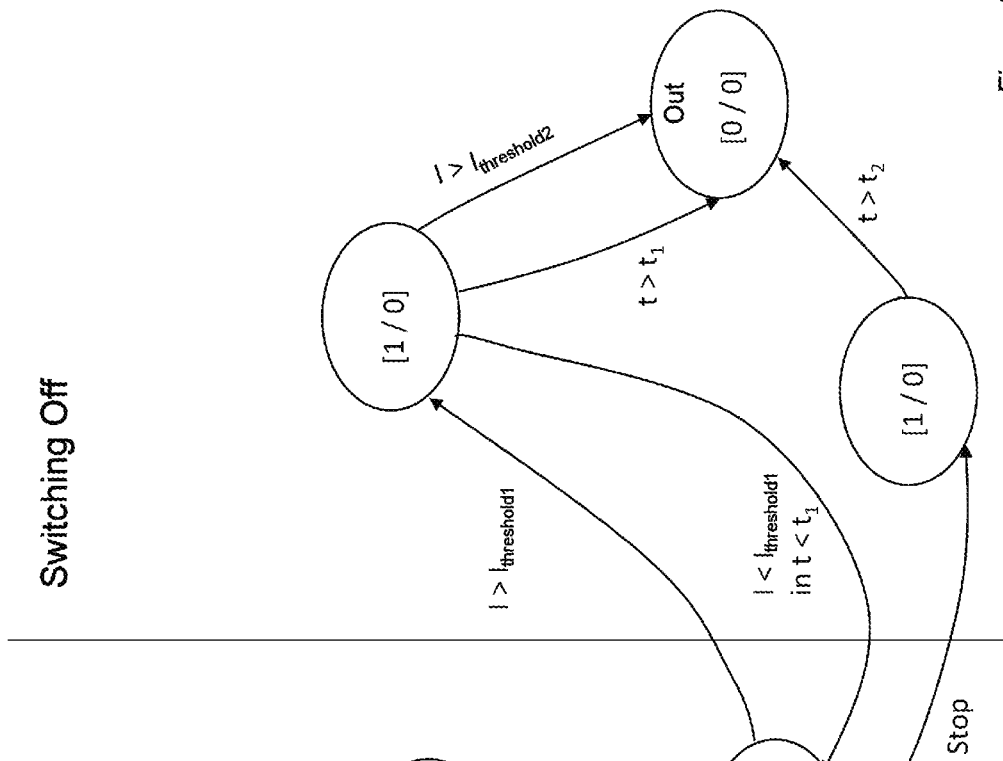
FIG. 2 is a state diagram including possible states of the bidirectional DC switching device.
Figure 2:
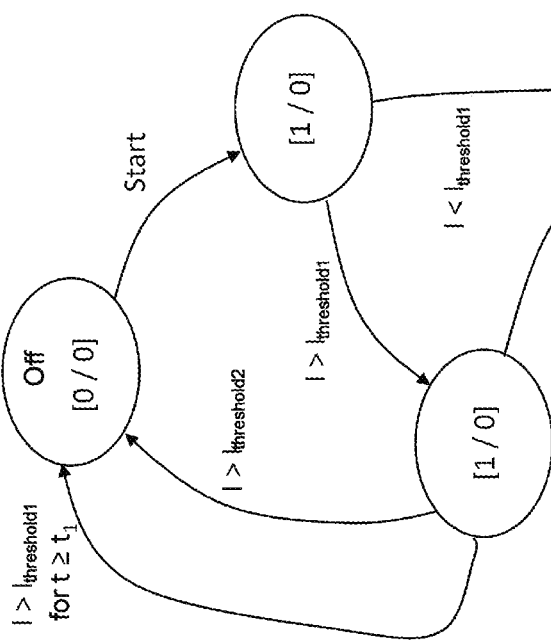

FIG. 2 is a state diagram for illustrating by way of example the method for controlling the switching device 1 shown in FIG. 1. In FIG. 1, the states of the switching elements 8, 9 are denoted "0" for non-conductive (switching element closed) and "1" for conductive (switching element open). The first entry in square brackets applies to the first switching element 8a, 8b, for example an IGBT, while the second entry specifies the second switching element 9a, 9b, for example an SiC-MOSFET. The "OFF" states denote a closed switching unit 10a, 10b, and are shown twice in FIG. 2 merely for improved clarity. The "Operation" operating state means that the corresponding switching unit 10a, 10b is conducting current and is fully open, in other words both switching elements 8, 9 are open/conductive. The labels "Start" and "Stop" denote explicit signals from the control unit 5 to open or close the addressed switching unit 10a, 10b. In other words, these are commands which take place independently of any control interventions, for example if emergency closing becomes necessary as a result of excessively high currents, an excessively rapid increase in current and/or an excessively large decrease in voltage. These commands may also be supplied from outside the control unit, for example by a superordinate control system or by an operator.

In the following, for the sake of simplicity, the method and steps are described with reference to measured currents and corresponding first and second current thresholds. As stated above, however, these steps may also additionally or alternatively comprise the first derivative of the current with respect to time, using corresponding predetermined thresholds. Further, the steps described in the following in connection with FIG. 2 may also be carried out on the basis of detected voltages and corresponding voltage decrease thresholds, for example a first and a second, in addition or as an alternative to the current and the two described current thresholds.

In FIG. 2, an emergency shutdown path is marked on the "Switching Off" side by the upper arrow proceeding from the "Operation" state. This path is activated if for example the measurement resistor 12 and the comparator 13 establish that the current exceeds a predetermined first threshold. Although it is not illustrated, this path may also alternatively or additionally be activated in the case of an excessively rapid increase in current. The first current threshold is denoted $I_{threshold1}$ in FIG. 1. The first threshold value may for example be the nominal value $I_0$ of the current flowing through the switching device 1 or the corresponding switching device 10. However, the value may also be a multiple thereof, for example $1.25*I_0$. In principle, in this context all currents and thresholds should be placed in relation to the nominal value $I_0$ of the current. As is shown in FIG. 2, the threshold being exceeded (and the detection thereof) brings about shutdown of the second switching element 9a, 9b of the actuated switching unit 10a, 10b or all switching units 10a, 10b. For this purpose, the comparator 13 outputs for example the above-described signal "Comp-Out", which displays that the threshold is exceeded and simultaneously causes the control unit 5 to introduce the measures which lead to the corresponding switching element 9a, 9b being closed/set to be non-conductive. These measures were described above, and may for example involve the voltage source 7b being short-circuited by closing the assigned switches of the switches 6a-d.

The state after the second switching element 9a, 9b is closed is shown at the top right of FIG. 2. There are three possible paths from this state. One path leads back to the operation state. This is the case if the value of the current falls below the threshold $I_{threshold1}$ again within a predetermined first time period, which may for example be 40-100 ms. Complete shutdown is thus no longer necessary, since there is no longer a threat to the safety of the switching device 1, and it is possible to return to operation more rapidly and without major switching losses/power losses, in particular because there is no shutdown of the first switching element 8a, 8b. It should be noted that the current may be measured and checked continuously and constantly, in such a way that the information about the current strength can be available at all times. By way of a possible monitoring device for the flowing current, this value may also be made available externally. As a result, the current level can be assessed without additional devices.

Further, a further step in the shutdown method may be that after a predetermined time period $t_1$ the first switching element 8a, 8b is likewise switched to be non-conductive, without the current being taken into account further. This situation occurs in particular if the current remains above the first threshold $I_{threshold1}$ over the entire time $t_1$, but does not increase above a second current threshold $I_{threshold2}$. The second threshold $I_{threshold2}$ may be set in such a way that it corresponds to the maximum of the tolerable voltage values of the first switching element 8a, 8b. This may for example be a value of $2*I_0$ or $2.5*I_0$. For the second current threshold too, as was described previously for the first, a maximum gradient may additionally or alternatively be set, in other words a first derivative of the current with respect to time.

If the current increases above the second threshold $I_{threshold2}$ after the second switching element 9a, 9b is shut down, the further path shown in FIG. 2 engages, and triggers immediate complete shutdown (see "Off" state, bottom right of FIG. 2).

As discussed above, the control unit 5 also provides the option of shutting down on the basis of a stop command, this being represented by the lower path in FIG. 2, leading from "Operation" to "Off". In this case, a "stop command" is initially outputted, and after the second switching element 9a, 9b is thereupon switched to be non-conductive, after complete inactivation thereof, the first switching element 8a, 8b is set to be non-conductive. For this purpose, a second time period $t_2$ may be set, after the expiration of which the deactivation of the first switching element 8a, 8b can be actuated.

The above-described sequences for switching off a switching unit 10a, 10b or the switching device 1 have in particular the technical advantages that the safety of the components is ensured at all times and that the losses are minimized, since initially the first, more critical switching element 8a, 8b and subsequently the second, more robust switching element 9a, 9b are switched to be non-conductive. In this way, the first switching element is protected during shutdown. As stated previously, the sequence during power-on is reversed.

Further, FIG. 2 also shows the power-on of the switching device 1 or of one or more switching units 10a, 10b. Starting from the "Off" state in the top left of FIG. 2, the control unit 5 gives a "start command", which leads to the second switching element 9a, 9b initially being switched to be conductive. When this process is complete, the first switching element 8a, 8b is also switched to be conductive. However, conditions apply here which influence the further steps. Thus, the first switching element 8a, 8b is not switched to be conductive as rapidly as possible if the above-described first current threshold $I_{threshold1}$ is exceeded after the second switching element 9a, 9b has been switched to be conductive. In this case, it may initially be tested whether the second threshold $I_{threshold2}$ is also exceeded, in such a way that, if this is the case, the second switching element 9a, 9b is switched to be non-conductive again. Further, it may also be tested whether, after the first threshold $I_{threshold1}$ is exceeded, the current strength falls below the value again within a first time period $t_1$. In this case, the first switching element 8a, 8b would be switched to be conductive. Otherwise, in other words if the current remains above $I_{threshold1}$ for a time period $t_1$, the second switching element 9a, 9b is closed again, in other words switched to be non-conductive, to protect the switching device 1.

It should be noted that the time periods introduced in the above need not all be equally long and need not all be of different lengths. Thus, the control unit 5 may only have one time period for all processes, but it is also possible for more than the two predetermined time periods described herein to be stored. Thus, for example, individual time periods may also be predetermined for all processes/decisions shown in FIG. 2 which may be time-dependent.

In summary, it may be concluded that the switching device 1 and the method for controlling it which are described herein combine the advantages of two different semiconductor switching elements with one another and use them in a manner optimized for safety and power efficiency. On this point, it should in particular be mentioned that the first switching element may be an IGBT, which in accordance with the control described herein absorbs high voltage, while the second switching element may be an SiC-MOSFET, which is connected so as to minimize power losses.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a", "an" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A DC switching device comprising:
    at least one switching unit arranged between two terminals; and
    at least one control unit for controlling the switching unit, wherein the at least one control unit comprises at least one switch;
    the switching unit comprising at least a first and a second semiconductor switching element, which are arranged in parallel with one another, the first switching element being a high-voltage switching element and the second switching element being a low-power-loss switching element,
    wherein the switching unit is controllable by the control unit such that:
        when the switching unit is switched off, initially the second switching element is switched to be non-conductive, and subsequently the first switching unit is switched to be non-conductive; and
        when the switching unit is switched on, initially the first switching element is switched to be conductive, and subsequently the second switching element is switched to be conductive.

2. The DC switching device of claim 1, comprising:
    at least two switching units, which are arranged between the two terminals such that a current flow direction can be assigned to each switching unit.

3. The DC switching device of claim 2, wherein the control unit is arranged between the two switching units and the two switching units are arranged symmetrically about the control unit.

4. The DC switching device of claim 1, wherein the first switching element is an IGBT and the second switching element is a MOSFET.

5. The DC switching device of claim 4, wherein the second switching element is an SiC-MOSFET.

6. The DC switching device of claim 1, comprising branch lines for a power conversion circuit, wherein the power conversion circuit comprises capacitors and the branch lines are each arranged between a switching unit and a terminal.

7. The DC switching device of claim 1, wherein the control unit comprises a current measurement device for detecting a current flowing through the switching unit.

8. The DC switching device of claim 1, wherein the control unit comprises at least first and second controlled voltage sources, of which the first are connected to a gate of the first switching element and the second are connected to a gate of the second switching element.

9. The DC switching device of claim 1, wherein the control unit comprises at least first and second gate drivers, of which the first are connected to a gate of the first switching element and the second are connected to a gate of the second switching element.

10. The DC switching device of claim 1, wherein the control unit comprises a rapid comparator, which is configured to compare a current measurement value with at least one reference value so as to detect a predetermined current threshold being exceeded.

11. The DC switching device of claim 10, wherein the rapid comparator is a 50 ohm comparator.

12. The DC switching device of claim 10, wherein the control unit is configured to initiate switching off the switching unit if it is detected that the predetermined (first) current threshold is exceeded.

13. A method for controlling a bidirectional DC switching device, the device comprising:
    at least one switching unit arranged between two terminals; and
    at least one control unit for controlling the switching unit;
    the switching unit comprising at least a first and a second semiconductor switching element, which are arranged in parallel with one another, the first switching element being a high-voltage switching element and the second switching element being a low-power-loss switching element,
    wherein the switching unit is controllable by the control unit such that:
        when the switching unit is switched off, initially the second switching element is switched to be non-conductive, and subsequently the first switching unit is switched to be non-conductive; and
        when the switching unit is switched on, initially the first switching element is switched to be conductive, and subsequently the second switching element is switched to be conductive;
    wherein in an initial state the switching elements of a switching unit are non-conductive, the method comprising:

switching the first switching element of the switching unit to be conductive;

measuring at least one of a current and a decrease in voltage flowing through the switching unit or occurring at the switching element after the first switching element is switched to be conductive;

switching the second switching element of the switching unit to be conductive if the current does not exceed a first current threshold and/or a first voltage decrease threshold is not exceeded; and switching the first switching element of the switching unit to be non-conductive if at least one of the current exceeds a second current threshold greater than the first current threshold and the detected fall in voltage exceeds a second voltage decrease threshold greater than the first voltage decrease threshold.

14. The method of claim 13, comprising:

testing whether the current falls below the first current threshold again within a predetermined first time period, if the current exceeds the first current threshold after the first switching element is switched to be conductive and does not exceed the second current threshold;

switching the first current element to be non-conductive if the current does not fall below a value of the first current threshold within the predetermined first time period; and switching the second switching element to be conductive if the current falls below the value of the first current threshold again within the predetermined first time period.

15. A method for controlling a bidirectional DC switching device comprising:

providing at least one switching unit arranged between two terminals; and providing at least one control unit for controlling the switching unit, wherein the at least one control unit comprises at least one switch;

the switching unit comprising at least a first and a second semiconductor switching element, which are arranged in parallel with one another, the first switching element being a high-voltage switching element and the second switching element being a low-power-loss switching element, wherein the switching unit is controllable by the control unit such that:

when the switching unit is switched off, initially the second switching element is switched to be non-conductive, and subsequently the first switching unit is switched to be non-conductive; and when the switching unit is switched on, initially the first switching element is switched to be conductive, and subsequently the second switching element is switched to be conductive;

wherein in an initial state the switching elements of a switching unit are conductive, the method comprising:

switching the second switching element of the switching unit to be non-conductive on a basis of a stop command; and switching the first switching element of the switching unit to be non-conductive after expiration of a predetermined second time period after the second switching element is switched to be non-conductive.

16. A method for controlling a bidirectional DC switching device comprising:

at least one switching unit arranged between two terminals; and at least one control unit for controlling the switching unit;

the switching unit comprising at least a first and a second semiconductor switching element, which are arranged in parallel with one another, the first switching element being a high-voltage switching element and the second switching element being a low-power-loss switching element, wherein the switching unit is controllable by the control unit such that:

when the switching unit is switched off, initially the second switching element is switched to be non-conductive, and subsequently the first switching unit is switched to be non-conductive; and when the switching unit is switched on, initially the first switching element is switched to be conductive, and subsequently the second switching element is switched to be conductive;

wherein in an initial state the switching elements of a switching unit are conductive, the method comprising:

switching the second switching element of the switching unit to be non-conductive if at least one of a current flowing through the switching unit exceeds a first current threshold and a decrease in voltage at the second switching element exceeds a first voltage decrease threshold;

measuring at least one of a current and a voltage flowing through the switching unit or occurring at the second switching element after the second switching element is switched to be non-conductive; and switching the first switching element of the switching unit to be non-conductive after a predetermined first time period if the current does not fall below the first current threshold in the predetermined first time period and/or the first voltage decrease threshold is still exceeded.

17. The method of claim 16, comprising:

switching the second switching element of the switching unit to be conductive if the current falls below the first current threshold again within the predetermined first time period.

18. The method of claim 16, comprising switching the first switching element to be non-conductive if current strength exceeds a second current threshold greater than the first current threshold after the second switching element is switched to be non-conductive.

* * * * *